United States Patent [19]

Sato

[11] Patent Number: 4,581,096

[45] Date of Patent: Apr. 8, 1986

[54] TAPE APPLYING DEVICE

[75] Inventor: Fumio Sato, Tokyo, Japan

[73] Assignee: Sumitomo Metal Mining Company Limited, Tokyo, Japan

[21] Appl. No.: 638,705

[22] Filed: Aug. 8, 1984

[30] Foreign Application Priority Data

Aug. 11, 1983 [JP] Japan ................. 58-146961

[51] Int. Cl.⁴ ............................................. B32B 31/18
[52] U.S. Cl. ........................... 156/513; 156/261; 156/267; 156/517; 156/518; 156/521
[58] Field of Search ........... 156/261, 262, 517, 518, 156/519, 520, 521, 530, 267, 513

[56] References Cited

U.S. PATENT DOCUMENTS

| | | | |
|---|---|---|---|
| 1,909,841 | 5/1933 | Perryman | 156/261 |
| 3,711,625 | 1/1973 | Dupuis | 156/261 |
| 4,279,682 | 7/1981 | Hamagami et al. | 156/518 |
| 4,289,568 | 9/1981 | Trotsky et al. | 156/518 |

*Primary Examiner*—Caleb Weston
*Attorney, Agent, or Firm*—Watson, Cole, Grindle & Watson

[57] ABSTRACT

A tape applying device for punching an annular piece out of an adhesive tape and applying the annular piece of adhesive tape to the inner leads of a lead frame having leads which extend outwardly therefrom in four general directions includes an inner pattern punch disposed along the direction of the travel of the adhesive tape on one surface side thereof and an outer pattern punch disposed along the direction of the travel of the adhesive tape on the same side as the inner punch on the downstream side relative to the inner punch. The outer pattern punch is provided with a press mechanism for applying under pressure the annularly shaped piece of the adhesive tape to the inner leads of the lead frame.

4 Claims, 11 Drawing Figures

TAPE APPLYING DEVICE

BACKGROUND OF THE INVENTION

1. Field of the Invention

This invention relates to a device for applying adhesive tape to inner leads of a semiconductor lead frame for the purpose of preventing the inner leads from falling out of alignment, and more particularly to a device for applying an annularly perforated piece of adhesive tape to all the inner leads of a lead frame having leads which extend outwardly in four general directions.

2. Description of Prior Art

In recent years, semiconductor lead frames have come to assume increasingly complicated configurations and their leads have been gradually growing in number. These lead frames are manufactured by pressing or etching. While they are being pressed or otherwise handled, the inner leads are liable to fall randomly out of alignment. This loss of alignment of the inner leads has caused a disconnection of connector wires when semiconductor pellets are disposed on tabs in lead frames and interconnecting the terminals of pellets and corresponding leads with connector wires or after the stage of resin molding.

to preclude this loss of alignment of the inner leads, it is known to apply to the inner leads, except for the tips thereof which are used for union with connector wires, an insulating tape which is resistant to heat and is incapable of thermal expansion or contraction and which includes an adhesive reagent. This application of an adhesive tape has heretofore been performed either manually or with the aid of a device adapted to apply such tape in parallel to leads extended in two opposite directions, e.g., as disclosed in U.S. Pat. No. 4,279,682. The manual application is disadvantageous because the work is not efficient and the accuracy of finish is appreciably dispersed. The mechanical application has a disadvantage that in the case of a DIP type lead frame a illustrated in FIG. 1, which has long inner leads extending in only two directions, parallel tapes c may be applied to the long inner leads b in a direction substantially perpendicular thereto but, in the case of a flat-packaging lead frame d illustrated in FIG. 2 which has long inner leads extending in four directions, parallel tapes applied only to the leads extending in two parallel directions will not to apply the lead extending perpendicular thereto.

In FIG. 2, e denotes a hole for determining the position of the lead frame d.

SUMMARY OF THE INVENTION

An object of this invention is to eliminate the aforementioned disadvantages of the prior art by developing a device for punching a squarish annular piece out of adhesive tape and applying this annular piece of adhesive tape by one shot to the inner leads b of a semiconductor lead frame which extend in four directions.

The other objects and characteristics of this invention will become apparent from the further disclosure of this invention to be made in the following detailed description of a preferred embodiment, with reference to the accompanying drawings.

DESCRIPTION OF THE PREFERRED EMBODIMENT

Figure 1:
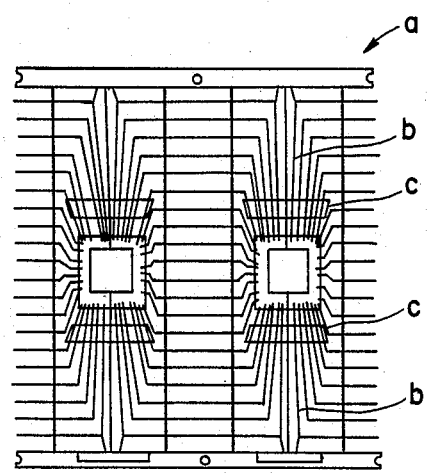
FIG. 1 and FIG. 2 are diagrams illustrating typical lead frame configurations.

One preferred embodiment of this invention will be described below with reference to the accompanying drawings.

The device of this invention comprises a mechanism for feeding adhesive tape, a mechanism for feeding a lead frame in a direction perpendicular to the direction of the travel of the adhesive tape, a mechanism for perforating a squarish annular piece out of the adhesive tape and applying this annular piece of the inner leads of the aforementioned lead frame, and a mechanism for controlling the relative timings of the operations of the mechanisms mentioned above.

The mechanism for feeding the adhesive tape comprises a tape feed reel 2 for accommodating a coil of adhesive tape 1, two pairs of upper rollers 3 and lower rollers 3a for nipping the tape 1 and driving it, a takeup reel 4 for rewinding the adhesive tape which has undergone perforation, and a takeup reel 5 for rewinding a spacer serving to protect the adhesive surface of the tape 1. The upper rollers 3 are adapted to be rotated by a pulse motor 7 through the medium of a belt 6. The lower rollers 3a, which are pivotally supported by a holder 8 having the central portion thereof pivotally supported in position, are urged upwardly in the direction of pressing the adhesive tape 1 against the rollers 3 by a spring 9 disposed below the side of the holder 8 taking hold of the lower roller 3a. Directly below the other end of the holder 8 is disposed a releasing bolt 10a vertically fastened to a lower die set 10. When the lower die set 10 is elevated, the leading end of the releasing bolt 10a urges the end of the holder 8 upwardly and consequently causes a fall of the lower rollers 3a pivotally supported on the other end of the holder 8. The upper rollers 3 and the lower rollers 3a, which are disposed respectively on the tape inlet side and the tape outlet side of the mechanism 11 for perforation and application of adhesive tape, are adapted to operate simultaneously.

Figure 3:
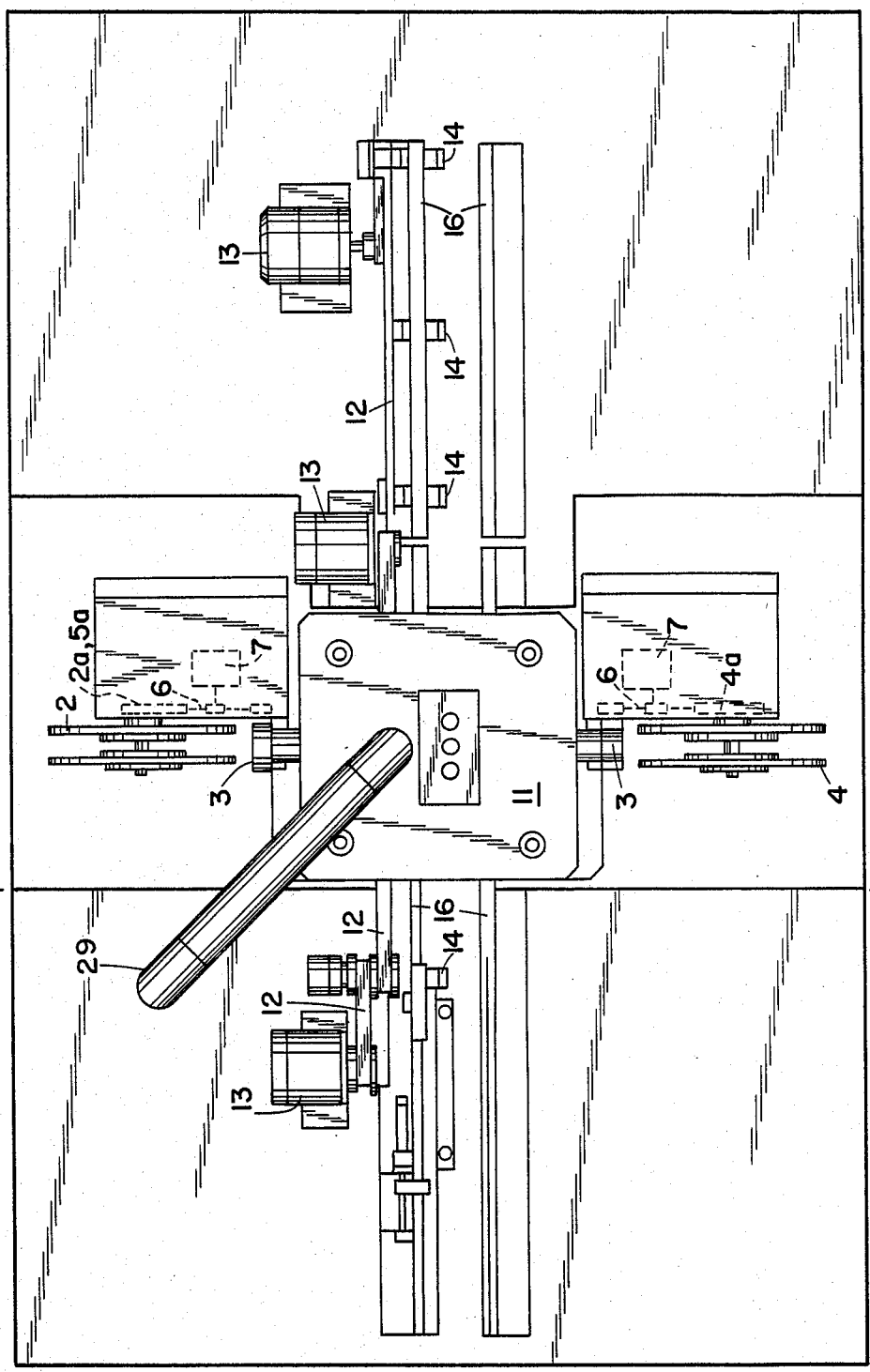
FIG. 3 is a plan view of the device of this invention.
Figure 4:
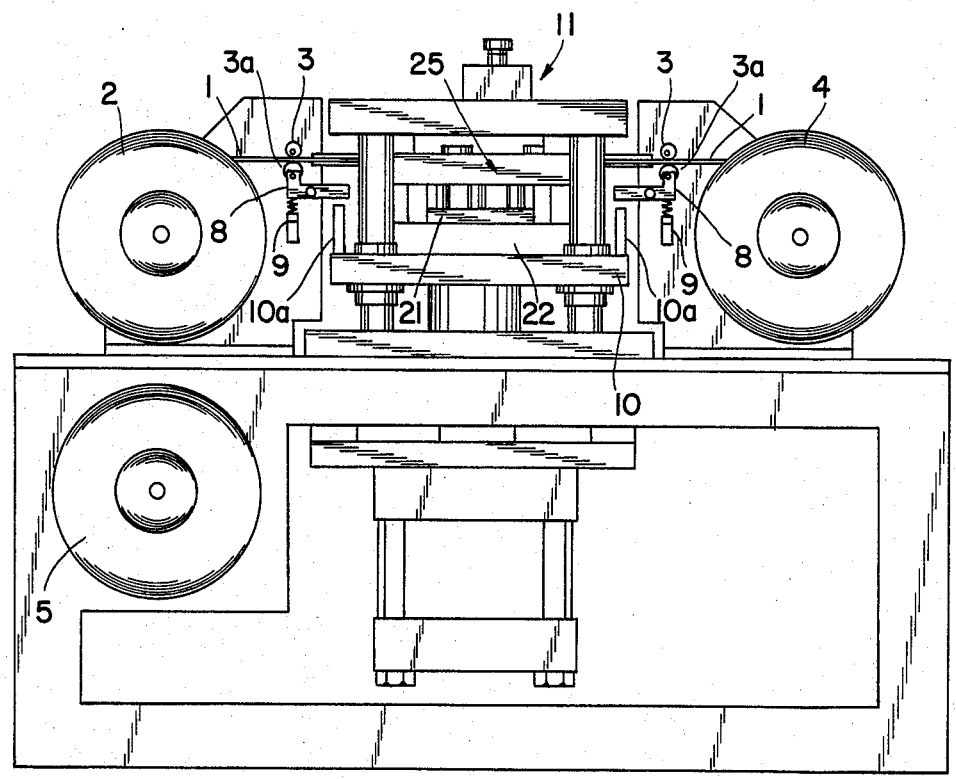
FIG. 4 is a cross section taken along the line IV—IV of FIG. 3.
Figure 5:
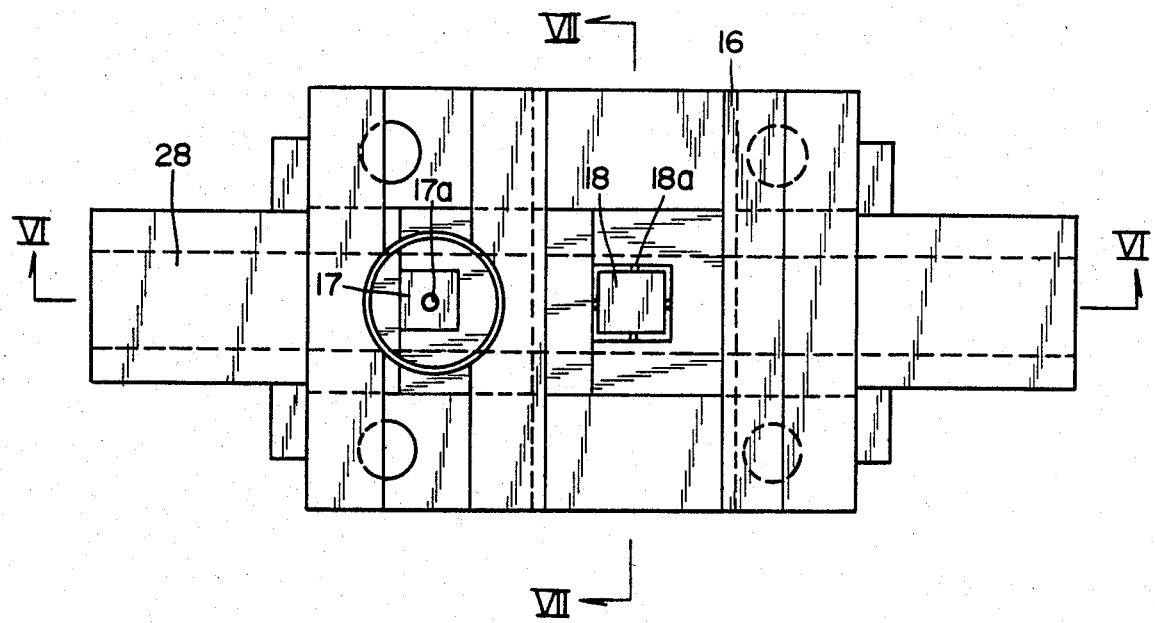
FIG. 5 is a plan view of a mechanism for perforating adhesive tape and applying a perforated piece of adhesive tape.

The tape feed reel 2, the tape takeup reel 4, and the spacer takeup reel 5 are pivotally supported respectively by clutch pulleys 2a, 4a, and 5a (clutch pulley 5a is located below clutch pulley 2a as shown in FIG. 3) which share one common shaft. The clutch pulleys 2a, 4a, and 5a are adapted to be driven collectively by the belt 6 serving to drive the rollers 3. They keep the adhesive tape or the spacer stretched with constant tension. Each time the adhesive tape is advanced by the rollers 3, 3a, these clutch pulleys follow their motion to feed out the adhesive tape 1 and, at the same time, take up the adhesive tape which has undergone perforation and the spent spacer.

Figure 7:
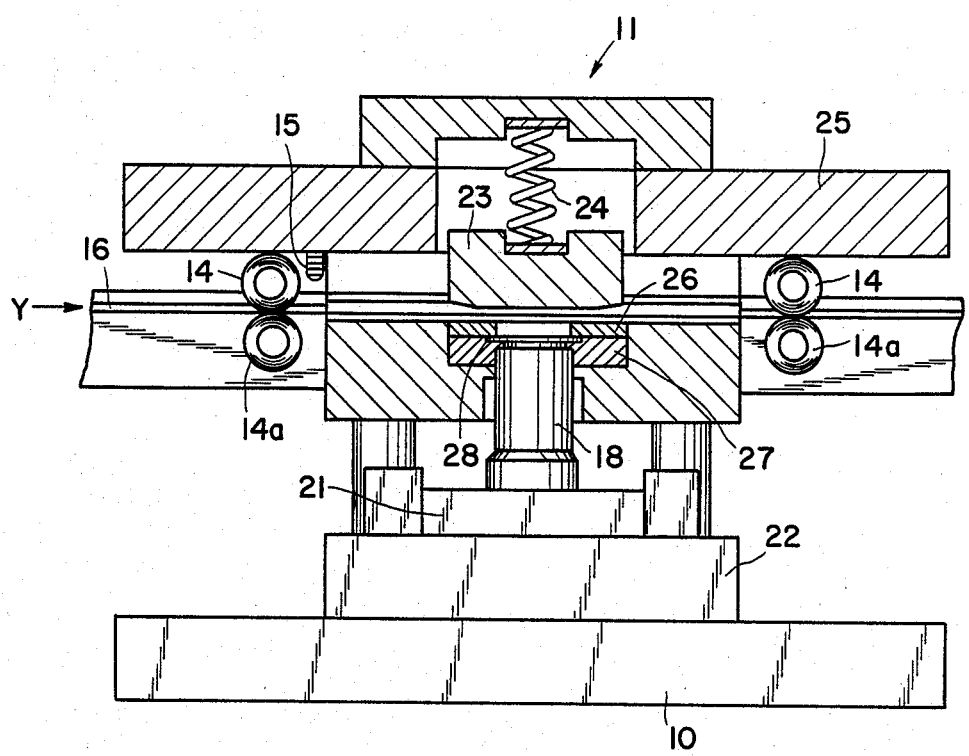
Figure 8A:
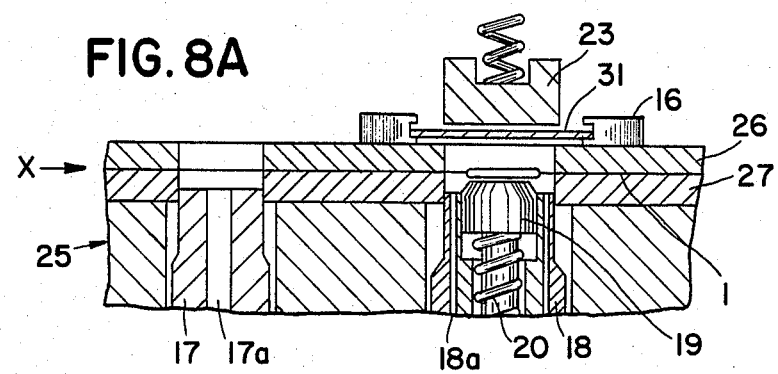
FIGS. 8A–8D depict the operation of the mechanism of FIG. 5.
Figure 8B:
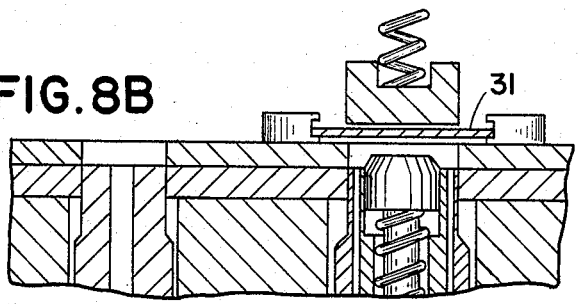
Figure 8C:
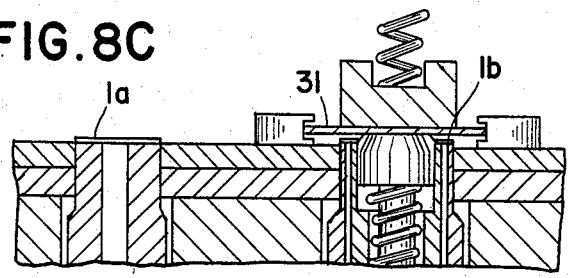
Figure 8D:
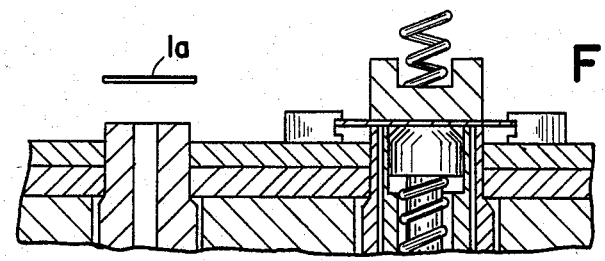

The mechanism for feeding the lead frame, as illustrated in FIG. 3 and FIG. 7, comprises several rollers 14 adapted to be driven by a pulse motor 13 through the medium of a synchronized belt 12, rollers 14a disposed directly below the rollers 14 and adapted to pinch the lead frame in cooperation with the rollers 14, a photosensor 15 serving to detect the position of the lead frame, and a pair of lead frame guides 16 serving to guide the lead frame. When the lead frame is set between the rollers 14, 14a on the inlet side of the mechanism 11, these rollers are set rotating to advance the lead frame through the lead frame guides 16 toward the mechanism 11 as indicated by the arrow Y in FIG. 7.

When the leading end of the lead frame reaches the photosensor 15 disposed near the entrance to the mechanism 11, the pulse motor 13 is turned by a desired number of cycles, with the result that the first group of leads of the lead frame will be brought to a stop at the position for application of adhesive tape. Then, the mechanism 11 is actuated and, on completion of the application of adhesive tape, the pulse motor 13 is again started to produce rotation by a desired number of cycles and bring the next group of leads of the lead frame to the position for application of adhesive tape. In this manner, lead frames are intermittently advanced. The lead frames which have undergone application of adhesive tape are successively discharged by the rollers 14, 14a on the outlet side.

Figure 6:
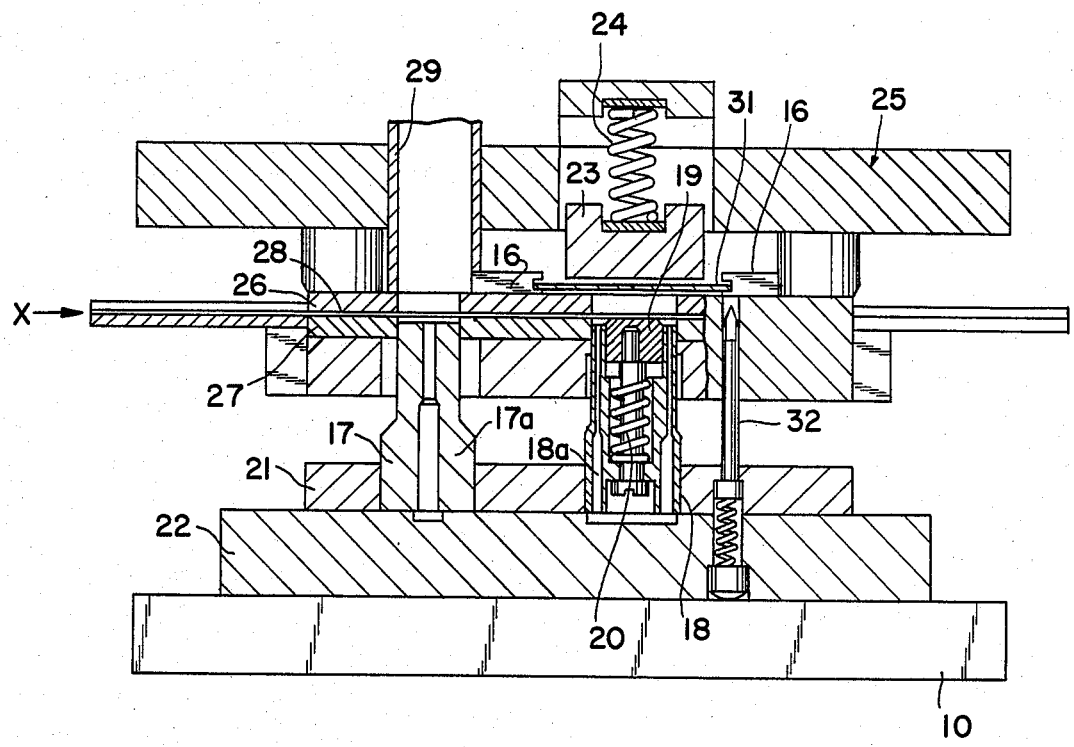
FIG. 6 and FIG. 7 are cross sections taken along the lines VI—VI and VII—VII of FIG. 5.

The essential parts of the mechanism 11, as illustrated in FIG. 6 and FIG. 8, are an inner pattern punch 17 and an outer pattern punch 18 for perforating a squarish annular piece out of the adhesive tape 1 and a heater 23 serving to join the annular piece of adhesive tape with the lead frame. The shape of the upper end of the inner punch 17 is substantially equal to that of the inner edge of the annular piece of adhesive tape desired to be obtained. The inner punch 17 is provided at the center in the axial direction thereof with an air channel 17a adapted to blow out the perforated inner pattern of adhesive tape 1a. The shape of the upper end of the outer pattern punch 18 is substantially equal to that of the outer edge of the annular piece of adhesive tape. The four sides of the outer pattern punch 18 are each provided at the center thereof with a hole 18a formed in the axial direction for retaining the perforated piece 1b of adhesive tape by suction.

Further, inside the outer pattern punch 18, a pilot block 19 is pivotally supported by a spring 20 as idly inserted therein. The chamferred upper surface of the pilot block 19 protrudes from the upper surface of the outer pattern punch 18 and is allowed to be slid to some extent in the axial direction. The inner pattern punch 17 and the outer pattern punch 18 are disposed so as to permit their respective centers to coincide with the central line of the adhesive tape 1 and are vertically fixed with a punch holder 21 to a backing plate 22. The backing plate 22 is fixed to the lower die set 10 and is adapted to be vertically elevated by drive means not shown in the diagram. The heater 23 is suspended directly above the outer pattern punch 18 from an upper die set 25. To the upper die set 25 are fixed a die 26 and a stopper 27. In the die 26 and the stopper 27, holes of diameters substantially equal to the outer diameters respectively of the inner pattern punch 17 and the outer pattern punch 18 are bored at positions coinciding with the positions of the inner pattern punch 17 and the outer pattern punch 18.

Figure 2:
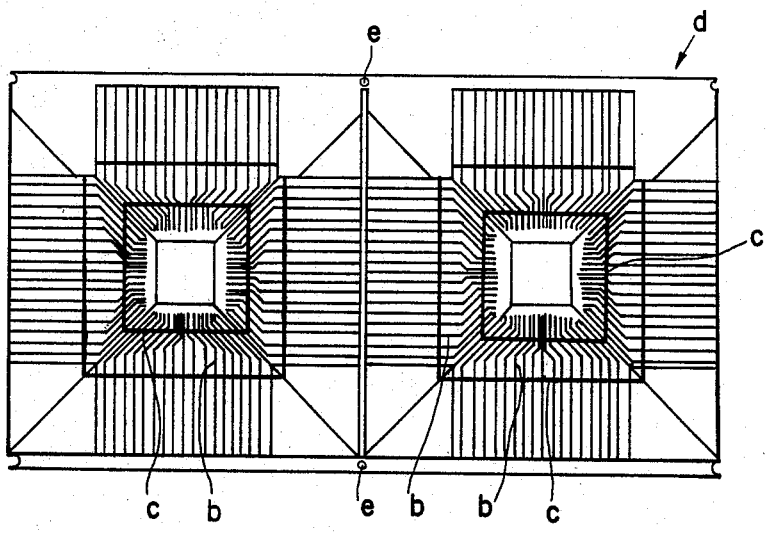

Now, the operation of the device of this invention constructed as illustrated above will be described below with reference to FIGS. 3-8. As the adhesive tape 1 is brought in by the upper and lower rolls 3, 3a along the tape guides 28 in the direction indicated by the arrow X in FIG. 6 and FIG. 8, the inner pattern punch 17 and the outer pattern punch 18 are elevated by drive means not shown in the diagram through the medium of the lower die set 10 and, at the same time, the rollers 3a are depressed by the releasing bolt 10a through the medium of the holder 8 and the adhesive tape is brought to a stop. The adhesive tape 1 so stopped is perforated by the cooperation of the inner pattern punch 17 and the die 26 as illustrated in FIG. 8A-8D. The inner pattern 1a of the adhesive tape thus perforated is blown up with the air spurted through the air channel 17a and discharged through a suction pipe 29. On the outer pattern punch 18 side, the pilot block 19 protruding from the upper surface of the outer pattern punch 18 fits itself in the hole formed in the adhesive tape by the inner pattern punch 17 and, at the same time, the suction hole 18a creates negative pressure therein. Consequently, the adhesive tape 1 is fastened by suction to the upper surface of the outer pattern punch 18. Then, the outer pattern punch 18 is elevated to perforate an outer pattern of the adhesive tape in cooperation with the die 26. The squarish annular piece 1b of adhesive tape produced by this perforation collides against the rear-side leads of the lead frame 31 which has been forwarded to a stated position inside the lead frame guide 16 disposed perpendicularly above the tape guide 28. Immediately before this collision, the leading end of a pilot pin 32 illustrated in FIG. 6 thrusts itself into the hole e in the lead frame d of FIG. 2 to check the position of the hole e. The pilot block 19 presses the lead frame 31 fast against the heater 23. As the result, the annular piece 1b of adhesive tape is joined to the rear-side leads of the lead frame 31 by the cooperation of the outer pattern punch 18 and the heater 23. After the perforated piece 1b of adhesive tape has been joined fast to the rear-side leads of the lead frame 31 over a stated length of time, the lower die set 10 is lowered and, at the same time, the adhesive tape 1 and the lead frame 31 are moved each by one spun respectively by the rollers 3, 3a and 14, 14a. By the repetition of the procedure described above, the device of this invention automatically perforates annular pieces successively out of the adhesive tape and applies the annular pieces to desired parts of lead frames.

By the use of the device of this invention, annular pieces are perforated out of the adhesive tape 1 and they are accurately joined in one shot to desired positions of leads of lead frames 31. Thus, the inner leads are prevented from loss of alignment and the lead frames enjoy high workability. By suitably altering the shapes of the inner pattern punch and the outer pattern punch, annular pieces of adhesive tape are allowed to be joined to desired positions of lead frames of a varying outline.

What is claimed is:

1. An apparatus for providing annular pieces of adhesive tape from a strip of adhesive tape and then applying the annular pieces of adhesive tape to respective lead frames having inner leads which extend outwardly therefrom in four general directions, each of the annular pieces of adhesive tape contacting all of the inner leads of a lead frame to which it is applied, said device including a die having first and second sides and first and second openings therethrough,
a die set which is movable toward and away from said first side of said die,
an inner pattern punch mounted on said die set so as to extend toward said first opening in said die, an outer pattern punch mounted on said die set adjacent said inner pattern punch so as to extend toward said second opening in said die, said outer pattern punch including a pilot block movably mounted therein for movement toward and away from said die, first feeding means for feeding a strip of adhesive tape on a stepwise fashion between said die and said die set so as to first pass between said inner pattern punch and said die and then said outer pattern punch and said die, and second feeding means for feeding lead frames having inner leads extending outwardly therefrom in four general directions in a stepwise fashion over said second side of said die and over said second hole therethrough, said apparatus operating such that said die set moves toward said die when a strip of adhesive tape fed by said first feeding means is stopped in position between said die set and said die such that said inner pattern punch moves into said first hole in said die and punches out an inner pattern from the strip of adhesive tape at a point along its length, leaving a corresponding hole in said strip of adhesive tape, said die set then being moved away from said die, whereafter said first feeding means moves said strip of adhesive tape until said corresponding hole is located between said outer pattern punch and said second hole in said die, whereafter said die set moves toward said die such that said pilot block moves into said corresponding hole in said strip of adhesive tape and said outer pattern punch moves into said second hole in said die and punches said strip of adhesive tape around said corresponding hole to provide an annular piece of tape, after which said outer pattern punch applies said annular piece of tape to a lead frame located over said second hole in said die by said second feed means.

2. The apparatus as defined in claim 1, wherein said inner pattern punch includes means forming a channel therethrough through which air can flow to blow each inner pattern cut thereby from said strip of adhesive tape through said first hole in said die.

3. The apparatus as defined in claim 2, including a suction pipe for removing inner patterns from said first hole in said die which have been punched from said strip of adhesive tape by said inner pattern punch.

4. The apparatus as defined in claim 2, wherein said outer pattern punch includes a bore therein, and wherein said pilot block is movably mounted within said bore by a spring.

* * * * *